(12) United States Patent
Aoki et al.

(10) Patent No.: US 7,342,241 B2
(45) Date of Patent: Mar. 11, 2008

(54) METHOD AND APPARATUS FOR ELECTRON-BEAM LITHOGRAPHY

(75) Inventors: Yasuko Aoki, Hitachi (JP); Tsutomu Tawa, Hitachinaka (JP); Yoshimitsu Saze, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 404 days.

(21) Appl. No.: 11/179,628

(22) Filed: Jul. 13, 2005

(65) Prior Publication Data
US 2006/0011080 A1 Jan. 19, 2006

(30) Foreign Application Priority Data
Jul. 15, 2004 (JP) ............................. 2004-208692

(51) Int. Cl.
*G21K 5/04* (2006.01)
*H01J 33/00* (2006.01)

(52) U.S. Cl. .............................. 250/492.22; 250/492.1; 250/492.2; 250/492.3; 250/396 R; 250/398

(58) Field of Classification Search ............ 250/492.22, 250/492.1, 492.2, 492.3, 396 R, 398, 400
See application file for complete search history.

(56) References Cited

U.S. PATENT DOCUMENTS

2002/0085184 A1* 7/2002 Amano ...................... 355/30
2003/0071231 A1* 4/2003 Haraguchi et al. ..... 250/492.22

FOREIGN PATENT DOCUMENTS

| JP | 07-211612 | 8/1995 |
| JP | 2003-017394 | 1/2003 |
| JP | 2003-124096 | 4/2003 |

* cited by examiner

*Primary Examiner*—Robert Kim
*Assistant Examiner*—Michael Maskell
(74) *Attorney, Agent, or Firm*—McDermott Will & Emery LLP

(57) ABSTRACT

The present invention is to provide an electron-beam lithography method and an electron-beam lithography apparatus that can draw patterns with a high precision despite a change in barometric pressure, can ensure a satisfactory throughput, and are inexpensive. In the electron-beam lithography method that uses an electron beam to draw patterns on a sample, a difference between a current measured barometric pressure and a previous measured barometric pressure, and an elapsed time between their barometric pressure-measurement points in time are determined. When the rate of the difference of their barometric pressures with respect to the elapsed time is equal to or larger than a prescribed barometric pressure change rate value, a drawing precision is calibrated.

12 Claims, 6 Drawing Sheets

FIG. 4

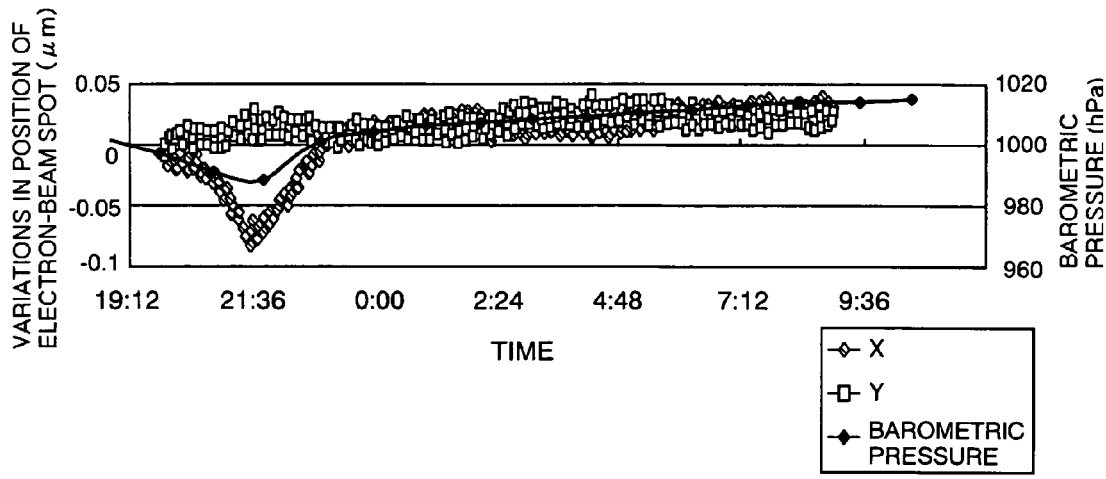

FIG. 5

REGULAR DRAWING
CALIBRATION MENU

|  | PERIOD OF STABLE BAROMETRIC PRESSURE | | PERIOD OF CHANGING BAROMETRIC PRESSURE | |
|---|---|---|---|---|
| DAILY | ONCE A DAY | 20 MIN | ONCE A DAY | 20 MIN |
| PER DRAWING (LOT) | AT INTERVALS OF 6 HOURS | 15 MIN | AT INTERVALS OF 6 HOURS | 15 MIN |
| PER DRAWING (WAFER) | AT INTERVALS OF 30 MIN | 10 MIN | AT INTERVALS OF 30 MIN | 10 MIN |
| DURING DRAWING | AT INTERVALS OF 2 MIN | 10 SEC | AT INTERVALS OF 2 MIN | 10 SEC |
| OCCURRENCE OF CHANGE IN BAROMETRIC PRESSURE | – | – | OCCURRENCE OF CHANGE IN BAROMETRIC PRESSURE | 10 MIN |

BAROMETRIC PRESSURE CHANGE
DRAWING CALIBRATION MENU

FIG. 6

|  | '2004.1.1 | '2004.1.2 | '2004.1.3 | '2004.1.4 | '2004.1.5 | '2004.1.6 | '2004.1.7 |
|---|---|---|---|---|---|---|---|
| 1:00 | 1005.5 | 1010.9 | 1008.6 | 1014.6 | 1022 | 1020.1 | 1021.4 |
| 2:00 | 1006.3 | 1011.3 | 1008.7 | 1015 | 1022.1 | 1019.8 | 1021.3 |
| 3:00 | 1006.9 | 1011 | 1008.4 | 1015.6 | 1021.7 | 1019.4 | 1020.8 |
| 4:00 | 1007.6 | 1010.2 | 1008.1 | 1016 | 1021.5 | 1018.9 | 1020.4 |
| 5:00 | 1008.5 | 1010 | 1008.4 | 1016.8 | 1021.2 | 1019 | 1020.2 |
| 6:00 | 1009.5 | 1010 | 1009.2 | 1018 | 1021.8 | 1019 | 1020.6 |
| 7:00 | 1010.1 | 1010.5 | 1009.8 | 1018.8 | 1022.1 | 1019.3 | 1020.6 |
| 8:00 | 1011 | 1010.8 | 1010.2 | 1020.1 | 1022.6 | 1019.9 | 1020.8 |
| 9:00 | 1011.9 | 1011.2 | 1010.6 | 1021 | 1022.9 | 1020.4 | 1020.9 |
| 10:00 | 1012.2 | 1010.8 | 1010.4 | 1021.1 | 1022.6 | 1020.2 | 1020.5 |
| 11:00 | 1011.5 | 1009.1 | 1009.6 | 1020.2 | 1021.8 | 1019.3 | 1019.3 |
| 12:00 | 1010.4 | 1008.1 | 1008.6 | 1019.5 | 1021.1 | 1018.3 | 1017.8 |
| 13:00 | 1010.5 | 1007.4 | 1007.8 | 1019.2 | 1020.7 | 1017.8 | 1017.1 |
| 14:00 | 1010.9 | 1007.1 | 1007.5 | 1019.2 | 1020.3 | 1018.1 | 1016.8 |
| 15:00 | 1011.2 | 1007.1 | 1008 | 1019.3 | 1020.4 | 1018.5 | 1016.7 |
| 16:00 | 1011.6 | 1007.2 | 1008.8 | 1019.8 | 1020.8 | 1019.2 | 1016.4 |
| 17:00 | 1012.4 | 1007.5 | 1009.6 | 1020.3 | 1020.8 | 1019.2 | 1016.5 |
| 18:00 | 1013.2 | 1007.5 | 1010.4 | 1021 | 1021.2 | 1019.7 | 1016.3 |
| 19:00 | 1013 | 1008.4 | 1011.4 | 1021.6 | 1021.2 | 1020.1 | 1015.8 |
| 20:00 | 1012.6 | 1008.9 | 1012 | 1022.4 | 1020.8 | 1020.7 | 1015.3 |
| 21:00 | 1012.8 | 1008.7 | 1012.7 | 1022.6 | 1021 | 1021 | 1014.4 |
| 22:00 | 1012.5 | 1008.8 | 1013.3 | 1022.3 | 1020.9 | 1021.3 | 1013.3 |
| 23:00 | 1011.7 | 1008.5 | 1013.7 | 1022.3 | 1020.7 | 1021.6 | 1012.3 |
| 24:00 | 1011.7 | 1008.6 | 1014.2 | 1021.9 | 1020.2 | 1021.3 | 1011.2 |

METHOD AND APPARATUS FOR ELECTRON-BEAM LITHOGRAPHY

CLAIM OF PRIORITY

The present application claims priority from Japanese application serial no. 2004-208692, filed on Jul. 15, 2004, the content of which is hereby incorporated by reference into this application.

FIELD OF THE INVENTION

The present invention relates to a method and apparatus for electron-beam lithography. More particularly, the present invention is concerned with calibration of a precision in drawing.

BACKGROUND OF THE INVENTION

Electron-beam lithography apparatus draws patterns onto a sample such as a mask, a wafer, or the like by exposure of an electron beam. Since an electron beam used for the drawing is susceptible to ambient circumstances including temperature, barometric pressure, and magnetism, the position of a beam spot, a focal point, a state of deflection, and a shaped beam size change over time. This causes drawing disorder or degradation of a precision in drawing. In order to correct the degradation of the drawing precision and draw patterns accurately, the electron-beam lithography apparatus must perform calibration from time to time.

In the electron-beam lithography apparatus, when calibrating the precision in drawing, a reference mark inscribed on a plane flush with a drawing plane is moved to a position immediately below the electron beam. The electron beam is irradiated to reference mark, and the calibration is carried out by optimizing the electron beam according to the intensity of electrons reflected from the reference mark or the intensity of electrons transmitted through the reference mark.

The frequency of calibration may be determined diversely, that is, may be determined as "monthly," "weekly," "daily," "in units of a lot," or "at every time of drawing." An operator determines the calibration frequency and a calibration menu according to an ambient condition or the stability of the apparatus. A Change in temperature or magnetism is coped with by preparing a thermostatic chamber using a magnetic shield so as to stabilize temperature and humidity and prevent magnetic noise from entering. As for the change in barometric pressure, no measures have been taken in the apparatus in the past. In many cases, the change in barometric pressure has caused deformation of a vacuum tank and has been regarded as a factor of degradation of the precision of the apparatus.

Referring to FIG. 3, a conventional example will be outlined below. As the example, an electron-beam lithography apparatus of a variable-beam shape/stage lock-on control type is adopted. Noted is that the present invention is not limited to any specific type of electron-beam lithography apparatus.

An electron beam 11 radiated from an electron source 1 is irradiated to a first mask 4 after being aligned by a beam aligner 2. A beam aligner control circuit 3 controls the beam aligner 2. The electron beam transmitted via the first mask 4 passes through a shaping lens 7 and reaches a second mask 8. When the electron beam is irradiated to the second mask 8, a control computer 15 instructs a shaping deflection control circuit 6 to determine a dimension of the electron beam-shape. The shaping deflection control circuit 6 applies a voltage on the determined dimension to the shaping deflector 5, whereby a rectangular electron beam passes through the second mask 8 so that it will have the determined dimension on a wafer 13.

The electron beam 11 transmitted through the second mask is demagnified by a demagnification lens 9. A position of deflection determined by the control computer 15 is set in the deflection control circuit 16. A deflection signal according to the determined deflection position is applied from the control circuit 16 to a positioning deflector 10. Thereby the electron beam 11 is deflected to the determined position, and then irradiated onto the wafer 13 on a stage 14 through an objective lens 12.

The position of deflection to be determined by the control computer 15 is calculated based on the result of measurement of a current stage position and coordinates representing a target position of drawing. The current stage position is always measured using a laser length meter 17. The laser length meter 17 has a mirror disposed on the wall of a vacuum tank. When the vacuum tank deforms due to the influence of changes in barometric pressure, the result of measurement of the current stage position contains an error.

Patent Document 1 (Japanese Patent Laid-Open No. 2003-17394) describes that a vacuum tank included in a apparatus has a double structure in efforts to cope with the above error. Namely, the barometric pressure in an outer tank is held constant and the laser length meter is put in an inner tank in order to improve a precision. However, as far as the electron-beam lithography apparatus is concerned, since the electron-beam lithography apparatus includes a mechanism for transporting a mask substrate or a wafer to the inside of the apparatus and a mechanism for driving a stage or any other internal moving member, a vacuum tank having a completely double structure cannot be adopted. The adverse effect of deformation of the wall of the vacuum tank cannot be eliminated.

Moreover, according to Patent Document 2 (Japanese Patent Laid-Open No. 2003-124096), a barometric pressure is monitored and the irradiated position on a sample of the electron beam is corrected proportionally according to the monitored change in barometric pressure in order to improve the precision in drawing.

However, experiments conducted by the present inventor et al. have revealed that a change in the state of an electron beam does not have a linearly proportional relationship to a change in barometric pressure. FIG. 4 graphically shows changes in barometric pressure and variations in the irradiated position of an electron-beam spot in the conventional electron-beam lithography apparatus. The scale of a graph is manipulated so that the indication of the variations in the irradiated position of the electron-beam spot and the indicated of the changes in barometric pressure overlap one another in the right-hand part of the graph. In the left-hand part of the graph, the barometric pressure changes sharply, and the variations in the irradiated position of the electron-beam spot differ from the changes in barometric pressure.

This signifies that the variations in the position of the electron-beam spot don't have a linearly proportional relationship to the changes in barometric pressure. If an attempt is made to artificially bring about a large change in barometric pressure, which is so large as to break the linearly proportional relationship, in order to determine a correction formula, a large-scale experiment must be conducted. The idea is therefore unfeasible. On the other hand, when a computer is used to perform simulation so as to determine the correction formula, quite a high calculating precision is required. It is very hard to calculate a degree of deflection of a correcting precision, which is on the order of nanometers and required as a precision in correction, relative to a structure of several meters high. There is a high possibility that the required correcting precision cannot be ensured.

SUMMARY OF THE INVENTION

The present invention addresses the foregoing problems. An object of the present invention is to provide an electron-beam lithography method and an electron-beam lithography apparatus that can draw patterns with a high beam positioning-precision despite a change in barometric pressure, can ensure a satisfactory throughput, and are inexpensive.

An electron-beam lithography method in accordance with the present invention is characterized in that a precision in drawing is calibrated according to a rate of a change in barometric pressure to a time.

According to the present invention, a calibration for a precision in drawing is carried out to a rapid change in barometric pressure adversely affecting the precision. When the change in barometric pressure occurs moderately, drawing is ceased and the precision in drawing is not calibrated. A decrease in a throughput can be suppressed.

Moreover, the frequency of calibration and the contents thereof are modified based on a change in barometric pressure, whereby a precision in drawing can be held satisfactory. Moreover, since a barometer alone is needed, the method is inexpensive.

BRIEF DESCRIPTION OF THE DRAWINGS

FIG. 4 graphically shows changes in barometric pressure in the electron-beam lithography apparatus and variations in the irradiated position of an electron-beam spot;

FIG. 5 lists examples of frequencies of calibration and required times for calibration at the time when a barometric pressure change speed equal to or higher than a prescribed value; and a barometric pressure change speed falling below the prescribed value;

FIG. 6 lists the results of measurement of a barometric pressure performed at Mito Local Meteorological Observatory from Jan. 1, 2004 to Jan. 7, 2004 inclusive;

DESCRIPTION OF THE PREFERRED EMBODIMENTS

Embodiments of the present invention will be described in conjunction with the drawings below.

Figure 1:
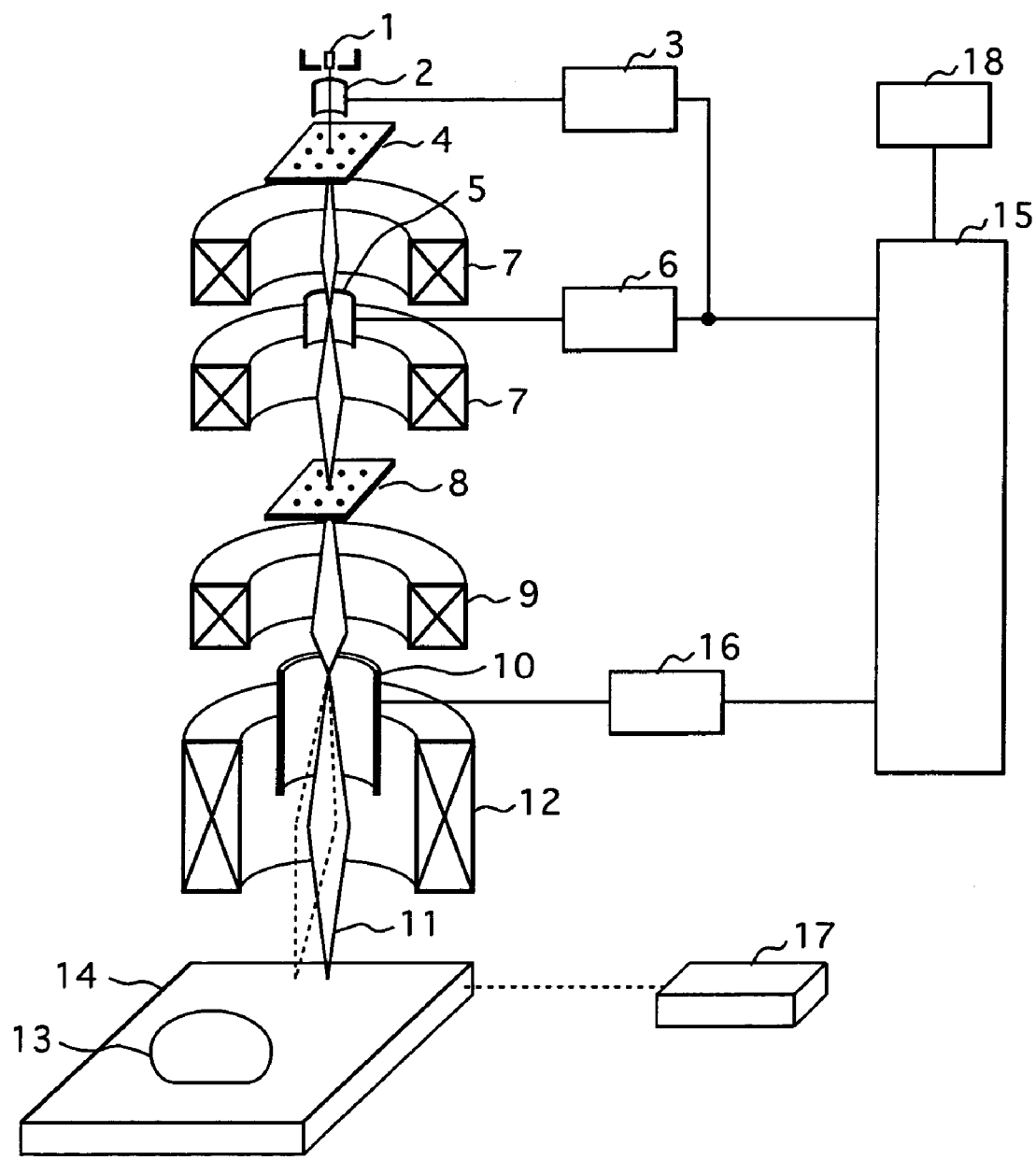
FIG. 1 schematically shows the construction of an electron-beam lithography apparatus in accordance with an embodiment of the present invention.

To begin with, an electron-beam lithography apparatus will be outlined below with reference to FIG. 1.

An electron beam 11 radiated from an electron source 1 is irradiated to a first mask 4 after being aligned by a beam aligner 2. A beam aligner control circuit 3 controls the beam aligner 2. The electron beam transmitted via the first mask 4 passes through a shaping lens 7 and reaches a second mask 8. When an electron beam is irradiated to the second mask 8, a control computer 15 instructs a shaping deflection control circuit 6 to determine a dimension for the electron beam-shape. The shaping deflection control circuit 6 applies a voltage on the determined dimension to the shaping deflector 5, whereby a rectangular electron beam is transmitted by the second mask 8 so that it will have the determined dimension on a wafer 13.

The shaping deflector 5 and shaping deflection control circuit 6 are generically called a deflecting means.

The electron beam 11 transmitted through the second mask is demagnified by a demagnification lens 9. A position of deflection determined by the control computer 15 is set in the deflection control circuit 16. A deflection signal according to the determined deflection position is applied from the control circuit 16 to a positioning deflector 10. Thereby the electron beam 11 is deflected to the determined position, and then irradiated onto the wafer 13 on a stage 14 through an objective lens 12. The stage 14 is driven to move by a driving means.

The position of deflection to be determined by the control computer 15 is calculated based on the result of measurement of a current stage position and coordinates representing a target position of drawing. The current stage position is always measured using a laser length meter 17. The laser length meter 17 has a mirror disposed on the wall of a vacuum tank.

A barometer 18 included in the electron-beam lithography apparatus measures a barometric pressure. Measurement data produced by the barometer 18 is transferred to the control computer 15.

The deflection control circuit 16, deflector 10, and objective lens 12 are generically called a deflecting means.

Figure 2:
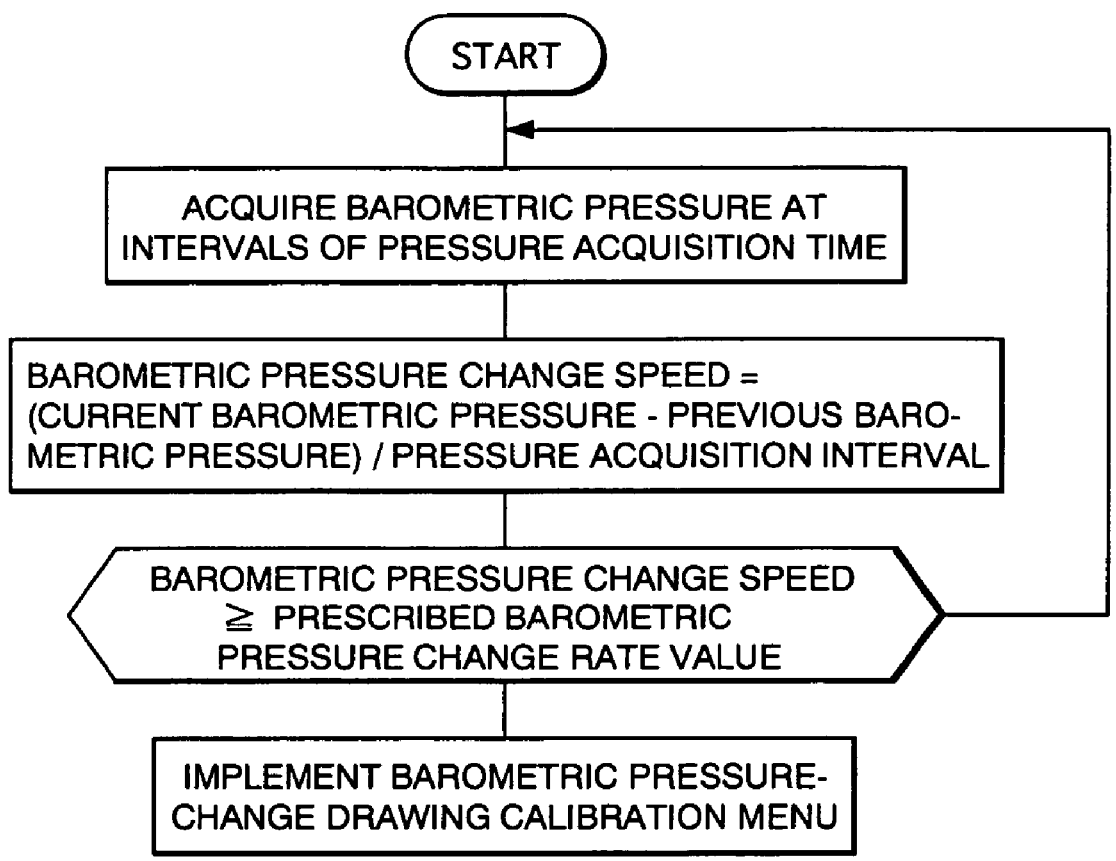
FIG. 2 is a flowchart describing actions to be performed in the electron-beam lithography apparatus in accordance with the embodiment of the present invention.
Figure 3:
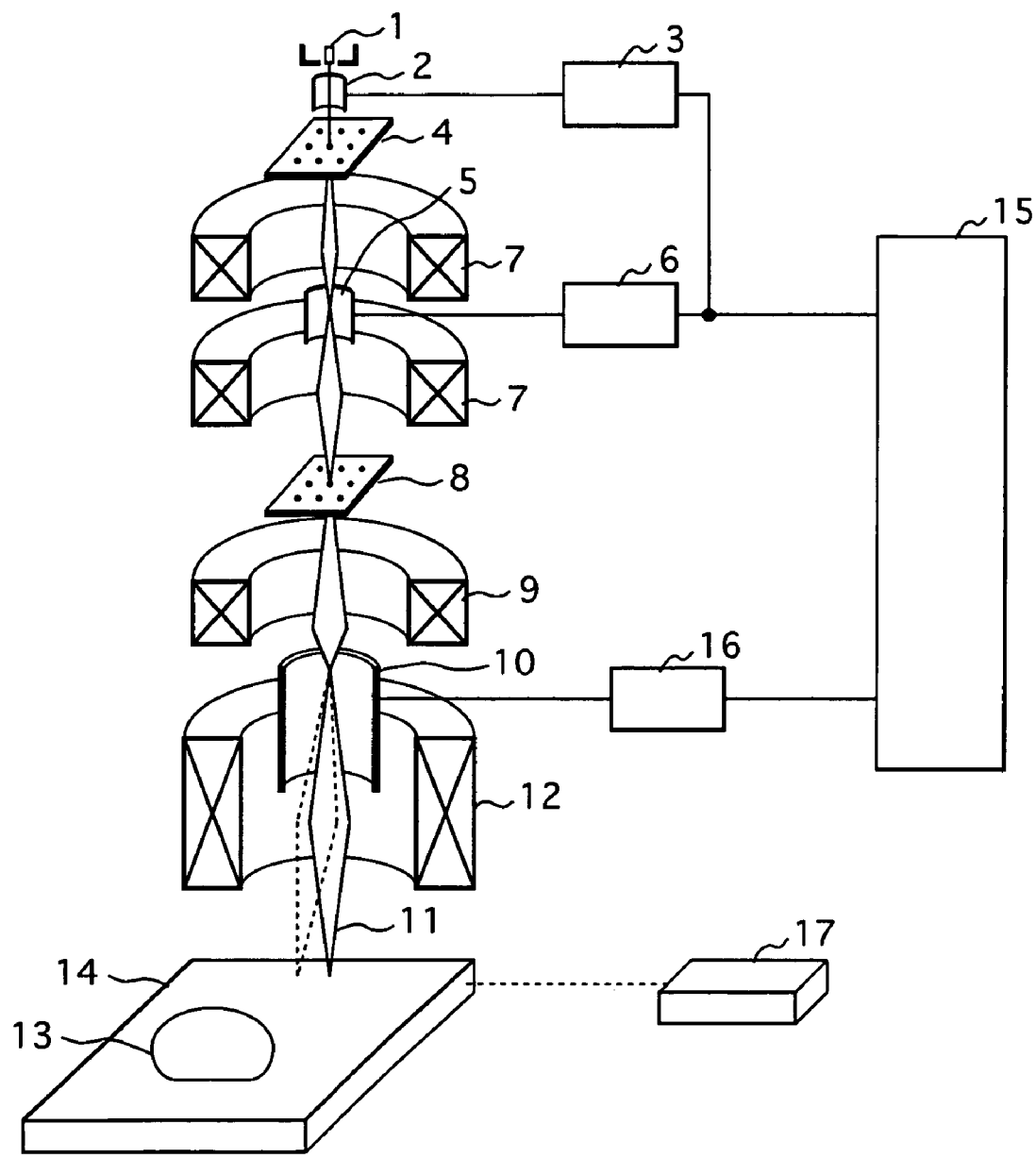
FIG. 3 schematically shows the construction of an electron-beam lithography apparatus in accordance with a related art.

Referring to FIG. 2, a sequence of actions performed in the control computer will be described below.

The control computer 15 acquires an output of the barometer 18 at intervals of a set time that is a pressure acquisition time. The set time of the pressure acquisition time is adjustable.

The control computer 15 calculates a difference between a current output (current measured barometric pressure) and a previous measured barometric pressure. A quotient of the difference by the pressure acquisition interval shall be regarded as a barometric pressure change speed. The pressure acquisition interval is an elapsed time between their barometric pressure-measurement points in time. The barometric pressure change speed is equivalent to the rate of change in barometric pressure with respect to time. A drawing calibration means, that calibrates a precision in drawing according to the rate of change in barometric pressure with respect to time, is realized with a program that is installed in the control computer 15.

The set time of the pressure acquisition interval is preset in the control computer 15. When the barometric pressure change speed, which is equivalent to the rate of change in barometric pressure with respect to time, is equal to or larger than a prescribed barometric pressure-change rate preset in the control computer 15, a drawing calibration menu is performed. The drawing calibration menu is preset in the control computer 15 to perform at the time of change in barometric pressure, and composed of a series of actions.

The drawing calibration menu shall be also called a barometric pressure-change drawing calibration menu.

By performing the barometric pressure-change drawing calibration menu, the control computer of the electron-beam lithography apparatus autonomously readjusts the state of an electron beam to an optimal state. Even when a change in barometric pressure is sharp, drawing can be achieved with a high beam-positioning precision attained. On the other hand, the barometric pressure change speed falls below the prescribed barometric pressure-change rate, the calibration to be triggered by measurement of a barometric pressure will not be performed.

FIG. 5 lists drawing calibration menus and times required for calibrations.

A menu other than the barometric pressure-change drawing calibration menu to be applied during occurrence of change in barometric pressure is a regular drawing calibration menu. When the barometric pressure change speed is equal to or larger than the prescribed value, the barometric pressure-change drawing calibration menu is performed. The time required for the performance is 10 min. The time required for daily performance of the regular drawing calibration menu is 15 min. The time required for performance of the barometric pressure-change drawing calibration menu is shorter than the time required for the regular drawing calibration menu. Thus, a decrease in a throughput can be minimized.

When the timing of performing the regular drawing calibration menu and the timing of performing the barometric pressure-change drawing calibration menu are conflict with each other, a higher priority is given to the barometric pressure-change drawing calibration menu. Consequently, even in the circumstances in which a large change in a barometric pressure occurs, for example, typhoon approaches, a satisfactory precision in drawing can be maintained.

Referring to FIG. 6, the frequency of performance of the barometric pressure-change drawing calibration menu will be described below.

FIG. 6 lists the measurements of a barometric pressure observed at the Mito Local Meteorological Observatory from Jan. 1, 2004 to Jan. 7, 2004 inclusive. During these days, the weather was fine or cloudy, and the maximum instantaneous wind velocity was 7.4 m. Measurement was performed every hour on the hour.

The relationship between a precision in drawing ensured by the conventional electron-beam lithography apparatus and a change in barometric pressure demonstrates that as long as a change in barometric pressure is about 2 hPa, drawing can be achieved with a satisfactory precision. Assuming that a pressure acquisition time is set to one hour and a set value of a barometric pressure change speed is determined as 1.5 hPa/h, an actually calculated barometric pressure change speed exceeded the set value (1.5 hPA/h) twice during the seven days (on Jan. 2nd and Jan. 7th) (hatched parts of FIG. 6).

Consequently, the frequency of performance of the barometric pressure-change calibration menu is 0.3 times a day. Since the performance of the calibration menu requires about ten min, about three minis required a day. In other words, since drawing is ceased for about three min, an adverse effect on a throughput is limited.

Barometric pressure data produced by the barometer 18 is input to the control computer 15. A set value of a pressure acquisition interval may be set in a lower-level control circuit instead of the control computer 15. Moreover, a barometric pressure change speed may be calculated using a trend exhibited by two or more measurements of a barometric pressure instead of a difference between a current and previous measurements. Moreover, for a higher drawing precision, when occurrence of a large change in barometric pressure is forecast because typhoon approaches, the pressure acquisition time may be shortened. An operator may be allowed to modify the set value according to weather.

Figure 7:
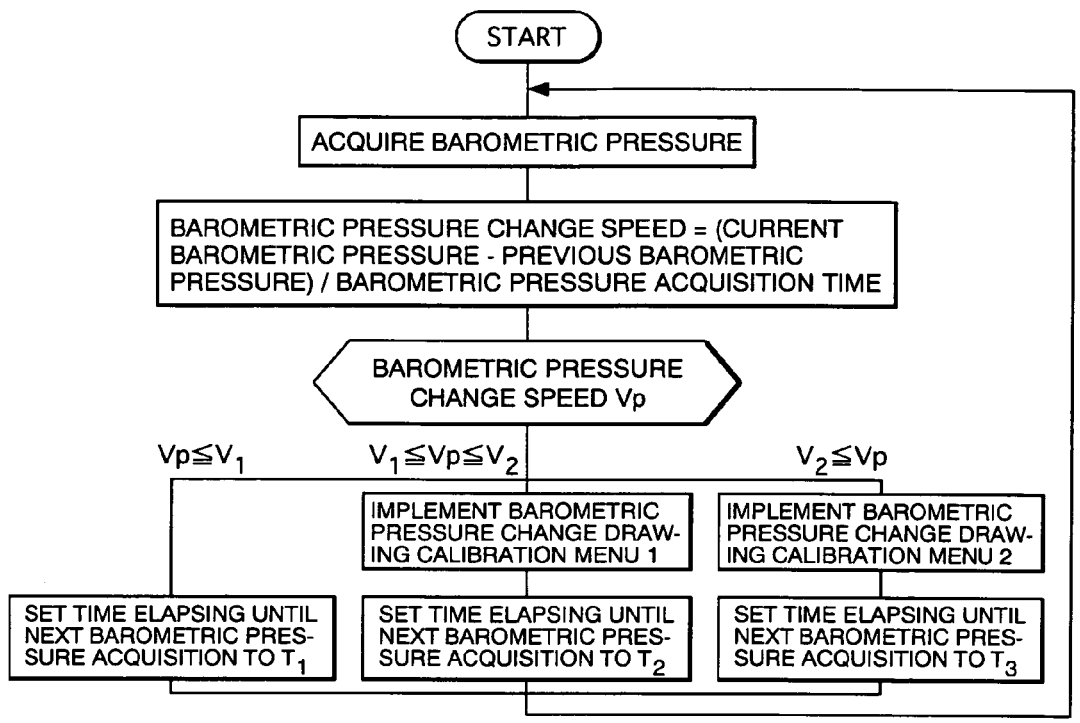
FIG. 7 is a flowchart describing actions to be performed in an electron-beam lithography apparatus in accordance with another embodiment of the present invention.

Referring to FIG. 7, another embodiment of the present invention will be described below.

FIG. 7 is a flowchart describing actions to be performed by the control computer.

The previous embodiment defines one condition, that is, one pressure acquisition interval. In contrast, in the embodiment concerned with FIG. 7, a plurality of pairs of a barometric pressure change speed and a pressure acquisition time are defined. A time elapsing until the next(new) acquisition of a barometric pressure is determined based on a barometric pressure change speed Vp calculated using barometric pressures measured at a previous time and a time preceding the previous time. The barometric pressure change speed Vp is equivalent to the rate of change in barometric pressure with respect to time.

Specifically, the barometric pressure change speed Vp is compared with a low prescribed barometric pressure change rate value that is a low threshold V1, and a high prescribed barometric pressure change rate value that is a high threshold V2. If the barometric pressure change speed Vp is equal to or lower than the low threshold V1, a set pressure acquisition interval elapsing until the next acquisition of a barometric pressure from the previous acquisition is set to t1. If the barometric pressure change speed Vp is equal to or higher than the high threshold V2, the set pressure acquisition interval elapsing until the next acquisition of a barometric pressure from the previous acquisition is set to t3. If the barometric pressure change speed Vp is higher than the low threshold V1 and lower than the high threshold V2, the set pressure acquisition interval elapsing until the next acquisition of a barometric pressure from the previous acquisition is set to t2. Incidentally, t1 denotes a long pressure acquisition time, t3 denotes a short pressure acquisition time, and t2 denotes an intermediate pressure acquisition time.

As mentioned above, when the barometric pressure change speed becomes to higher, the set pressure acquisition interval becomes to shorter. According to the present embodiment, the state of the apparatus can be held stable along with a change in barometric pressure irrespective of whether a barometric pressure change speed is high or low. Moreover, a calibration menu may be modified based on a variation in a barometric pressure change speed. Namely, when the barometric pressure change speed is high, extensive calibration is performed.

Figure 8:
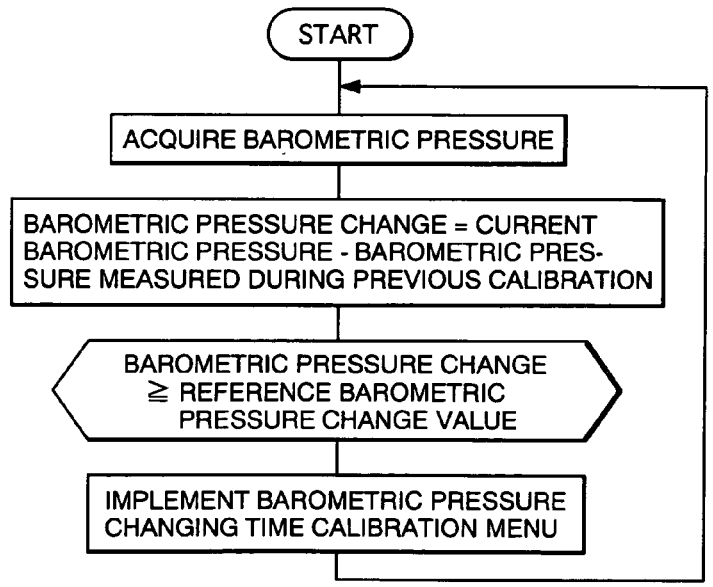
FIG. 8 is a flowchart describing actions to be performed in an electron-beam lithography apparatus in accordance with still another embodiment of the present invention.

Referring to FIG. 8, still another embodiment of the present invention will be described below.

FIG. 8 is a flowchart describing actions performed in the control computer.

According to the previous embodiment, the calibration is performed based on a barometric pressure change speed. According to the present embodiment, the calibration for precision in drawing is performed when change in barometric pressure occurring after previous calibration exceeds a reference barometric pressure change value. Even in the conventional electron-beam lithography apparatus, calibration is performed regularly irrespective of whether change in barometric pressure is large or not (equivalent to a case where a barometric change speed is, as indicated in FIG. 5, equal to or lower than a prescribed barometric pressure change rate value).

After performing the previous calibration, when a difference of a current (newly) measured barometric pressure and a previous measured barometric pressure is equal to or more than the reference barometric pressure change value preset in the apparatus, the drawing calibration menu composed of a series of actions and preset in the apparatus is re-performed. A pressure acquisition interval is preset in the control computer 15. The timing of acquiring a barometric pressure may be determined with a time having elapsed since performance of the calibration or may be determined using a timer that operates independently. According to the present embodiment, even if change in barometric pressure grows in a certain direction (the barometric pressure increases or decreases) accumulatively and continuously over a long period of time, or a normal drawing calibration time is set to a long time, drawing can be achieved with a high precision attained.

When the present invention is carried out, the sequence of actions used in any of the embodiments may be performed independently or the sequences of actions used in the respective embodiments may be performed in combination in order to verify whether calibration should be performed.

Moreover, a display means for displaying a regular drawing calibration menu and a barometric pressure-change drawing calibration menu, and an input means are included in the electron-beam lithography apparatus. The regular drawing calibration menu and barometric pressure-change drawing calibration menu are displayed on the display means. A user can enter data in a presented item while looking at the menu. Thus, maneuverability will prove excellent.

What is claimed is:

1. An electron-beam lithography method for drawing patterns onto a sample by using an electron beam, comprising:
   performing a calibration for precision in drawing when the rate of change in barometric pressure with respect to time is equal to or larger than a prescribed barometric pressure-change rate.

2. An electron-beam lithography method for drawing patterns onto a sample by using an electron beam, comprising:
   determining a difference between a current measured barometric pressure and a previous measured barometric pressure; and measuring an elapsed time between their barometric pressure-measurement points in time, performing a calibration for precision in drawing when the rate of the difference of the above-mentioned barometric pressures with respect to the elapsed time is equal to or larger than a prescribed barometric pressure-change rate.

3. The electron-beam lithography method according to claim 2, wherein
   two or more prescribed barometric pressure-change rates prescribed barometric change rates are predetermined; and
   a time interval for taking in barometric pressure data for measurement can be selectively set based on a result of comparing the rate of the difference of the above-mentioned barometric pressures with the prescribed barometric pressure-change rates.

4. The electron-beam lithography method according to claim 2, wherein:
   two or more prescribed barometric pressure-change rates are predetermined; and
   contents of calibration for precision in drawing to be performed are selected based on a result of comparing the rate of the difference of the above mentioned barometric pressures with the prescribed barometric pressure-change rates.

5. An Electron-beam lithography method for drawing patterns onto a sample by using an electron-beam, comprising:
   a regular drawing calibration menu for regularly performing calibration for precision in drawing, and
   a barometric pressure-change drawing calibration menu for performing a calibration for precision in drawing according to the rate of change in barometric pressure with respect to time.

6. The electron-beam lithography method according to claim 5, wherein when the timing of performing the regular drawing calibration menu and the timing of performing the barometric pressure-change drawing calibration menu are conflict with each other, a higher priority is given to the barometric pressure-change drawing calibration menu.

7. An electron-beam lithography apparatus for drawing patterns onto a sample by an electron beam exposure, comprising: an electron source for an electron beam, a deflecting means for shaping the electron beam or positioning the electron beam exposure, a stage for placing the sample, a driving means for moving the stage, and a control computer for controlling the deflecting means and driving means,
   wherein the electron-beam lithography apparatus further comprises a drawing calibration means for performing a calibration for precision in drawing according to the rate of change in barometric pressure with respect to time.

8. The electron-beam lithography apparatus according to claim 7, wherein the drawing calibration means is incorporated in the control computer.

9. The electron-beam lithography apparatus according to claim 7, further comprising a barometer for giving barometric pressure data to the drawing calibration means.

10. An electron-beam lithography apparatus for drawing patterns onto a sample by an electron beam exposure, comprising: an electron source for an electron beam, a deflecting means for shaping the electron beam or positioning the electron beam exposure, a stage for placing the sample, a driving means for moving the stage, and a control computer for controlling the deflecting means and the driving means,
   wherein the control computer has a regular drawing calibration menu for regularly performing calibration for precision in drawing, and a barometric pressure-change drawing calibration menu for performing a calibration for precision in drawing according to the rate of change in barometric pressure with respect to time.

11. The electron-beam lithography apparatus according to claim 10, further comprising a display means for displaying the regular drawing calibration menu and the barometric pressure-change drawing calibration menu, and an input means for inputting data to items displayed on the display means.

12. An electron-beam lithography method for drawing patterns onto a sample by using an electron beam, comprising:
   performing a calibration for precision in drawing when a difference between a current measured barometric pressure and a previous measured barometric pressure is equal to or larger than a reference value of barometric pressure change.

* * * * *